(12) United States Patent
Matsumoto et al.

(10) Patent No.: US 7,696,094 B2
(45) Date of Patent: Apr. 13, 2010

(54) METHOD FOR IMPROVED PLANARIZATION IN SEMICONDUCTOR DEVICES

(75) Inventors: David Matsumoto, San Jose, CA (US); Michael Brennan, Campbell, CA (US); Vidyut Gopal, Saratoga, CA (US); Jean Yang, Glendale, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/616,563

(22) Filed: Dec. 27, 2006

(65) Prior Publication Data

US 2008/0160764 A1    Jul. 3, 2008

(51) Int. Cl.
*H01L 21/302* (2006.01)

(52) U.S. Cl. .................. 438/693; 438/692; 438/724; 438/740

(58) Field of Classification Search .......... 438/692, 438/693, 700, 706, 720, 258, 261, 723, 724, 438/740; 216/88, 89
See application file for complete search history.

(56) References Cited

U.S. PATENT DOCUMENTS

| 6,797,565 | B1 * | 9/2004 | Yang et al. ............... 438/261 |
| 7,078,241 | B2 * | 7/2006 | Son et al. ...................... 438/3 |
| 2001/0045646 | A1 * | 11/2001 | Shields et al. ............. 257/734 |
| 2002/0134754 | A1 * | 9/2002 | Kim ............................ 216/39 |
| 2004/0033693 | A1 * | 2/2004 | Park et al. ................. 438/691 |
| 2004/0152337 | A1 * | 8/2004 | Tsukamoto ............... 438/763 |
| 2005/0266648 | A1 * | 12/2005 | Chung et al. .............. 438/296 |

* cited by examiner

*Primary Examiner*—Lan Vinh
(74) *Attorney, Agent, or Firm*—Harrity & Harrity, LLP

(57) ABSTRACT

A method for forming a semiconductor device may include forming a silicon oxynitride mask layer over a first layer. The first layer may be etched using the silicon oxynitride mask layer, to form a pattern in the first layer. The pattern may be filled with a dielectric material. The dielectric material may be planarized using a ceria-based slurry and using the silicon oxynitride mask layer as a stop layer.

17 Claims, 12 Drawing Sheets

METHOD FOR IMPROVED PLANARIZATION IN SEMICONDUCTOR DEVICES

TECHNICAL FIELD

The present invention relates generally to semiconductor manufacturing and, more particularly, to fabrication of integrated circuits.

BACKGROUND ART

The escalating demands for high density and performance associated with semiconductor devices, such as non-volatile, electrically erasable programmable read only memory (EEPROM) devices, require small design features, high reliability and increased manufacturing throughput. The reduction of design features, however, challenges the limitations of conventional methodology.

One particular problem with scaling memory devices to reduce their size is that the memory devices often exhibit degraded performance. For example, reducing the size of various structures in the memory devices, often results in an increased negative impact from fabrication processing techniques, such as etching techniques, deposition techniques, and the like. Techniques that perform well at larger sizes may introduce defects at a reduced scale. These problems may make it difficult for the memory device to be efficiently programmed and/or erased and, ultimately, may lead to device failure.

DISCLOSURE OF THE INVENTION

In one aspect, a method may include forming a silicon oxynitride mask layer over a first layer; etching the first layer using the silicon nitride mask layer, to form a pattern in the first layer; filling the pattern with a dielectric material; and planarizing the dielectric material using the silicon oxynitride mask layer as a stop layer.

In another aspect, a method for fabricating a semiconductor device may include forming a first dielectric layer over a substrate; forming a second dielectric layer over the first dielectric layer; forming a silicon oxynitride mask layer over the second dielectric layer; forming a photoresist layer over the silicon oxynitride mask layer; patterning the photoresist layer to define mask regions; etching the silicon oxynitride mask layer form a silicon oxynitride mask; etching the substrate, the first dielectric layer, and the second dielectric layer to form at least one isolation trench in a portion of the substrate not covered by the silicon oxynitride mask; filling the trench with an oxide material; planarizing the oxide material to an upper surface of silicon oxynitride mask using at least a ceria-based slurry; stripping the silicon oxynitride mask from the semiconductor device; forming a third dielectric layer over the second dielectric layer and the oxide material; and forming a control gate over at least a portion of the third dielectric layer.

In yet another aspect, a method is provided for fabricating a semiconductor device. The method may include forming a first dielectric layer over a substrate; forming a gate electrode layer over the first dielectric layer; forming a silicon oxynitride mask over the gate electrode layer; etching the first dielectric layer and the gate electrode layer based on the silicon oxynitride mask; forming a bitline region in a portion of the substrate not covered by the silicon oxynitride mask; forming an oxide layer over the semiconductor device, the oxide layer filling the regions not covered by the silicon oxynitride mask; planarizing the oxide layer to an upper surface of silicon oxynitride mask using at least a ceria-based slurry; stripping the silicon oxynitride mask from the semiconductor device; and forming a wordline conductor layer over the gate electrode layer and the oxide layer.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
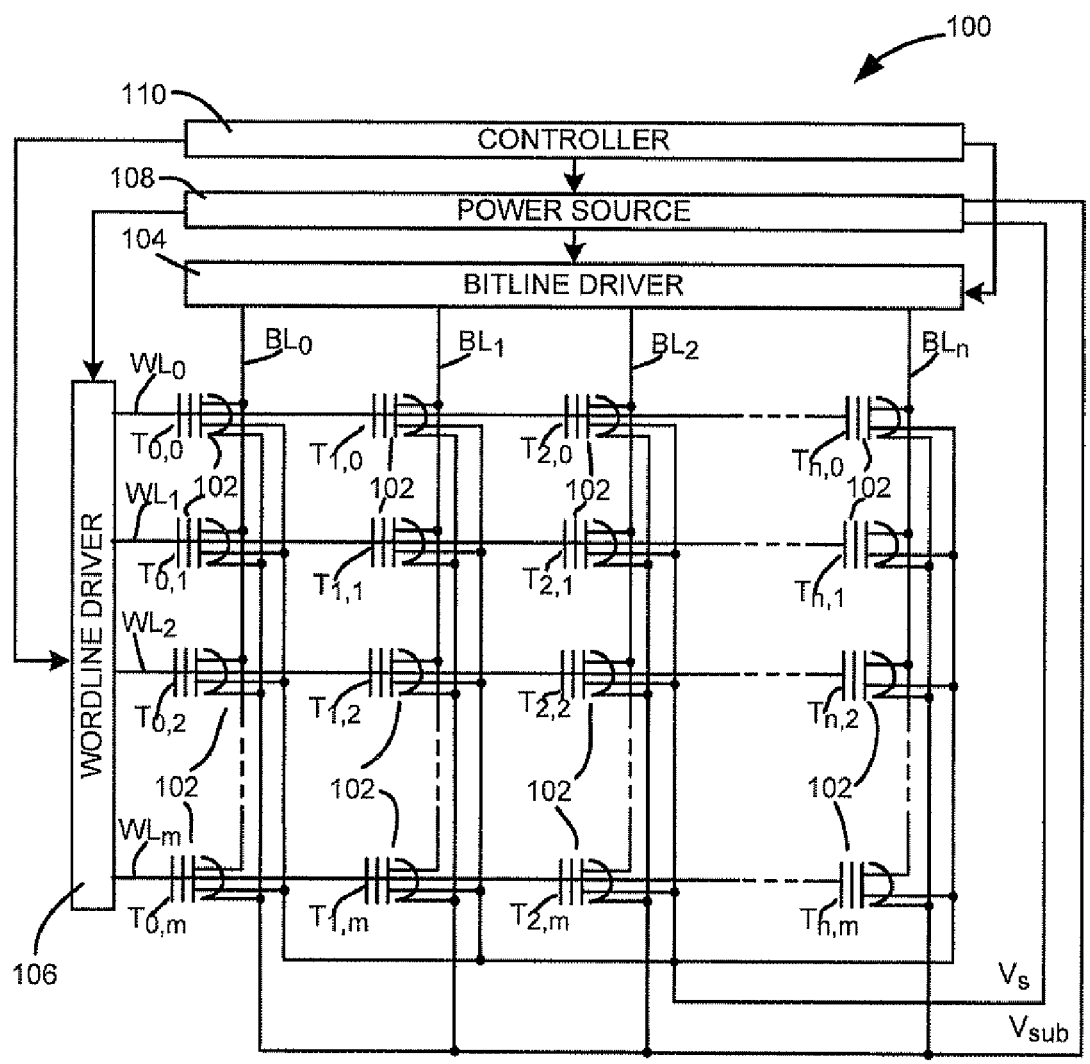
FIG. 1 illustrates an exemplary configuration of a flash EEPROM formed in accordance with one aspect described herein.

Implementations consistent with the present invention provide non-volatile memory devices with improved lithographic spacing, such as flash electrically erasable programmable read only memory (EEPROM) devices. FIG. 1 illustrates an exemplary configuration of a flash EEPROM 100 formed in accordance with an embodiment of the present invention. Flash memory 100 may include a plurality of memory cells 102, arranged in a rectangular matrix or array of rows and columns, a plurality of bitlines (BL) associated with each column, a plurality of word lines (WL) associated with each row, a bit line driver 104, a word line driver 106, a power source 108 and a controller 110.

Assuming that there are n columns and m rows in EEPROM 100, the bitlines may be designated as $BL_0$ to $BL_n$ and the wordlines may be designated as $WL_0$ to $WL_m$. Accordingly, there may be n+1 bitlines and m+1 wordlines. Bitline driver 104 applies appropriate voltages to the bitlines. Similarly, appropriate voltages are applied to the wordlines by wordline driver 106. The voltages applied to drivers 104 and 106 may be generated by a power source 108 under the control of a controller 110, which may include on-chip logic circuitry. The controller 110 may also control the drivers 104 and 106 to address the memory cells individually or collectively.

A memory cell 102 is located at each junction of a wordline and a bitline. Each cell 102 may include a Metal-Oxide-Semiconductor (MOS) Field Effect Transistor (FET) having a source and drain formed in a semiconductor substrate, a floating gate, and a control gate separated from the floating gate by an oxide-nitride-oxide (ONO) stack. Additional details regarding the formation of cell 102 will be described below in relation to FIGS. 2-12. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1 may be designated using the notation $T_{i,j}$, where j is the row (wordline) number and i is the column (bitline) number. The control gates of cells 102 are connected to respective word lines, and the drains of cells 102 are connected to respective bitlines as illustrated. The sources of all of the cells are connected to the power source 108.

Exemplary Processing

Figure 2:
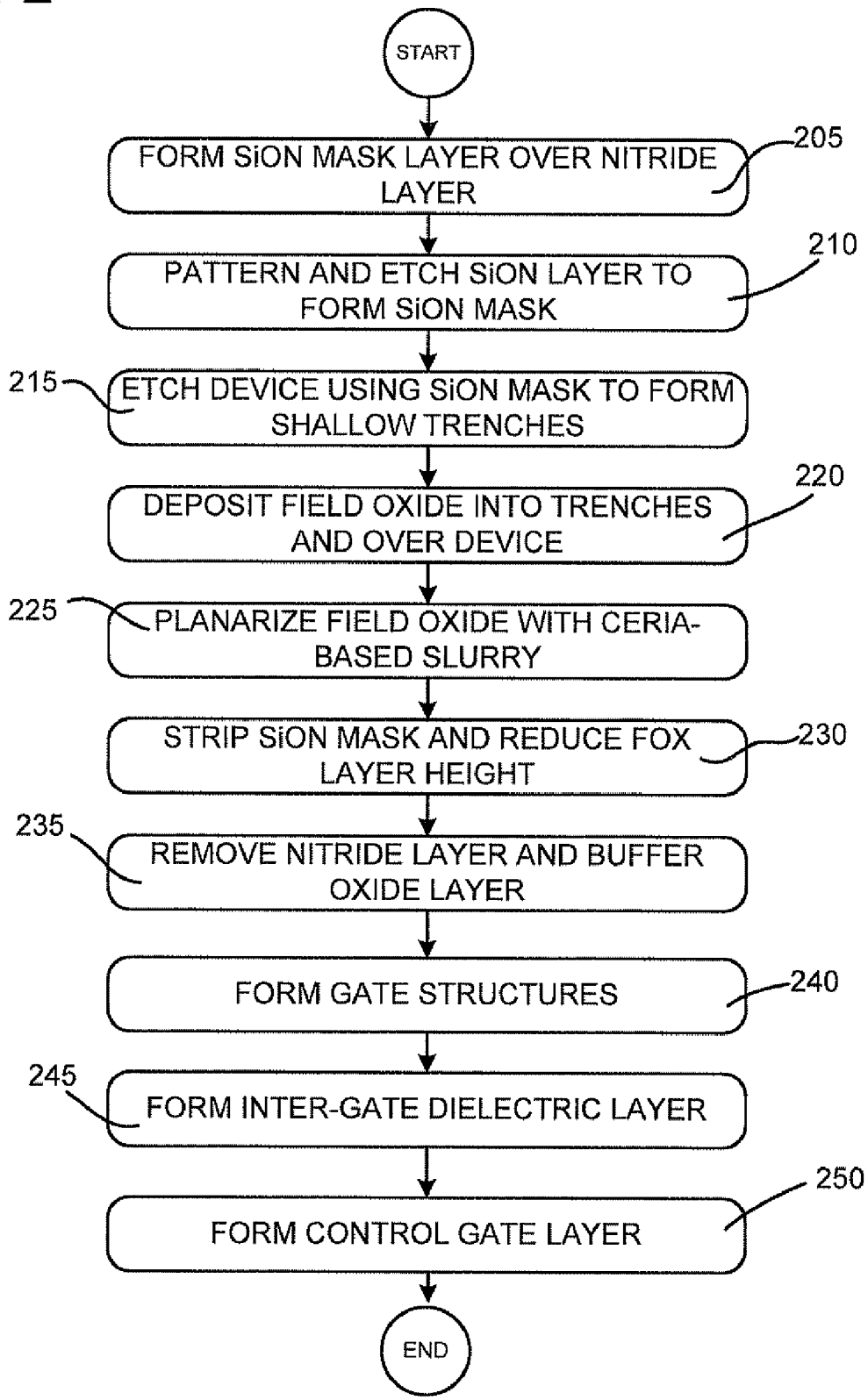
FIG. 2 is a flow diagram illustrating an exemplary process for forming a semiconductor memory device according to an aspect described herein.
Figure 3:
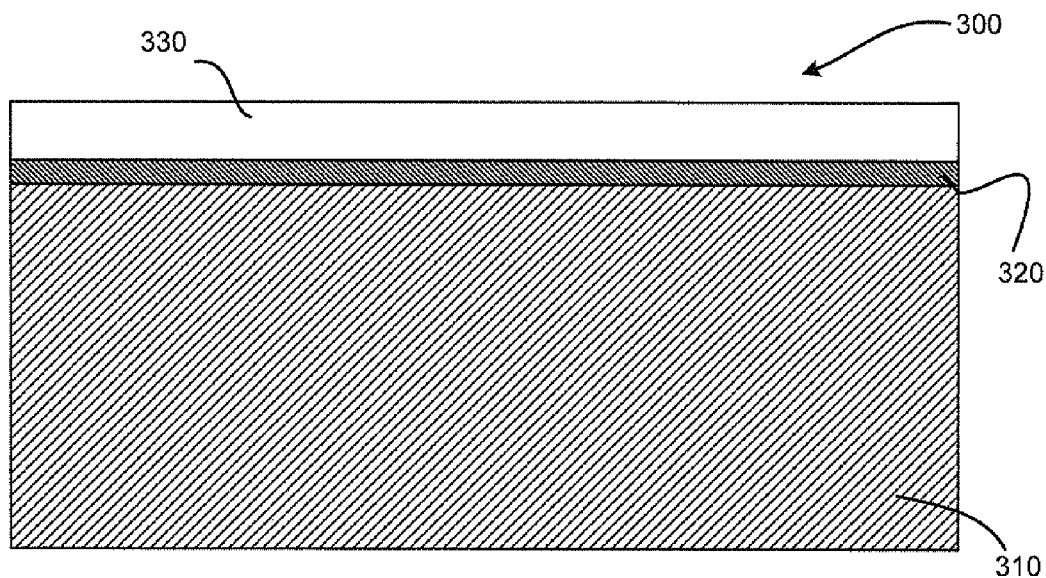
FIGS. 3-12 illustrate exemplary views of a semiconductor memory device fabricated according to the processing described in FIG. 2.

FIG. 2 illustrates an exemplary process for forming a semiconductor memory device in an implementation consistent with aspects described herein. In one implementation, the semiconductor memory device may include an array of memory cells of a flash memory device, such as that illustrated in FIG. 1. FIGS. 3-12 illustrate exemplary views of a semiconductor memory device fabricated according to the processing described in FIG. 2.

Processing may begin with a semiconductor device 300 that includes layers 310, 320, and 330. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be a dielectric layer formed on layer 310 in a conventional manner. In an exemplary implementation, dielectric layer 320 may include an oxide, such as a silicon oxide (e.g., $SiO_2$), and may have a thickness ranging from about 50 Å to about 350 Å. In one implementation consistent with principles of the invention, a suitable method for forming layer 320 may include thermal oxidation process of layer 310 at a temperature of about 750° C. to 1100° C. Alternatively, dielectric layer 320 may be deposited using a low pressure chemical vapor deposition (LPCVD) process performed at a temperature of about 400° C. to 800° C.

Layer 330 may be a second dielectric layer formed on layer 320 in a conventional manner. In one exemplary implementation, second dielectric layer 330 may include a nitride, such as silicon nitride (e.g., $Si_3N_4$), and may have a thickness ranging from about 400 Å to about 1200 Å. Nitride layer 330 may form a sacrificial layer for use in forming trenches and oxide regions described in additional detail below.

Figure 4:
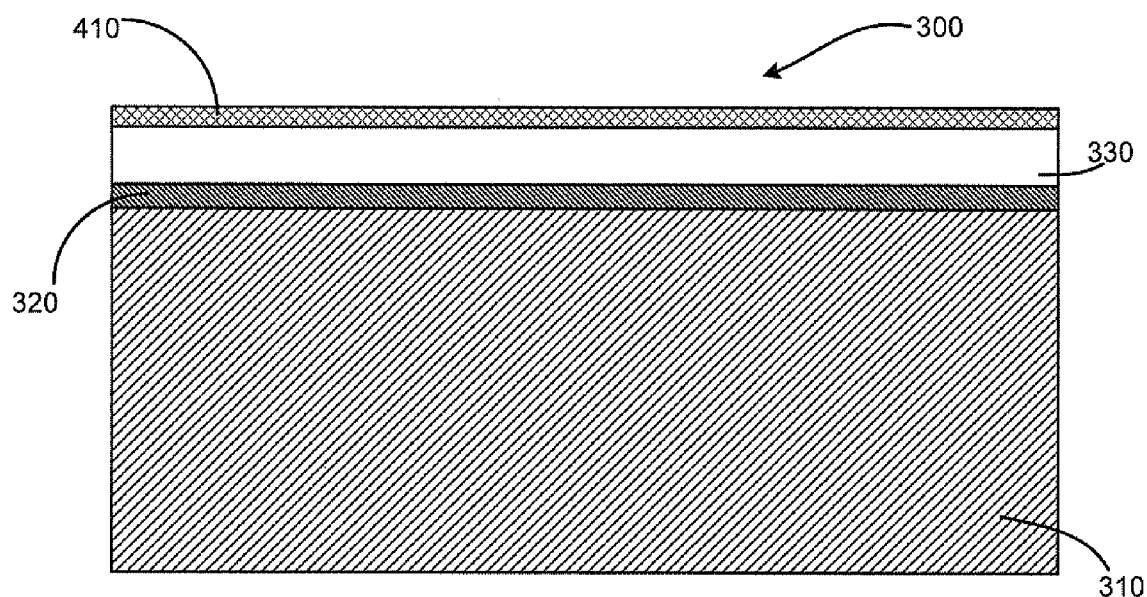

As shown in FIG. 4, a silicon oxynitride (SiON) mask layer 410 may be formed over layer 330 (act 205). In one exemplary implementation, SiON mask layer 410 may be formed by CVD, and may have a thickness ranging from about 100 Å to about 500 Å. SiON mask layer 410 may form an anti-reflective coating (ARC).

Figure 5:
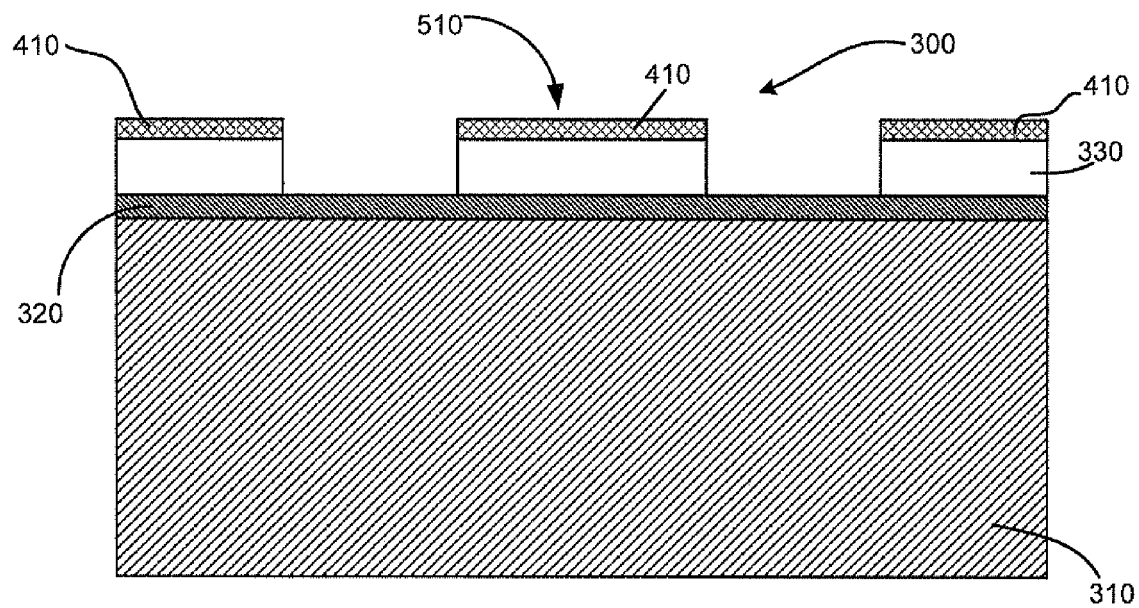

A photoresist material formed over mask layer 410 may be patterned and etched in a conventional manner to form a hard mask 510 on the top surface of layer 330, as illustrated in FIG. 5 (act 210). Mask 510 may be used to define active regions in the subsequently formed memory device and indicate areas that will not be etched during formation of isolation regions in semiconductor device 300. By providing anti-reflective coating SiON mask layer 410 beneath a photoresist material prior to performing photolithography, optical reflections of the radiation used to develop the mask pattern may be minimized. Accordingly, by using ARC SiON layer 410, a more precise lithography may be applied, resulting in narrower mask spacings.

Figure 6:
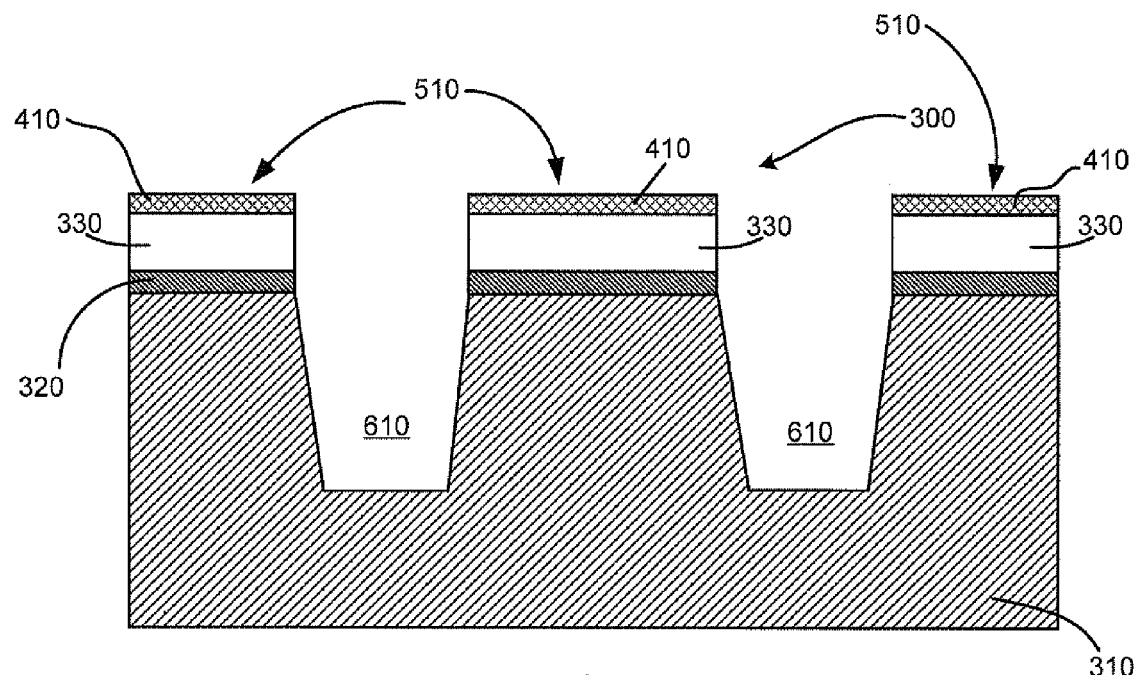

Semiconductor device 300 may then be etched, as illustrated in FIG. 6, to remove portions of layers 310 and 320, thereby forming shallow trenches 610 (act 215). The etch may also be referred to as a shallow trench isolation (STI) etch.

Figure 7:
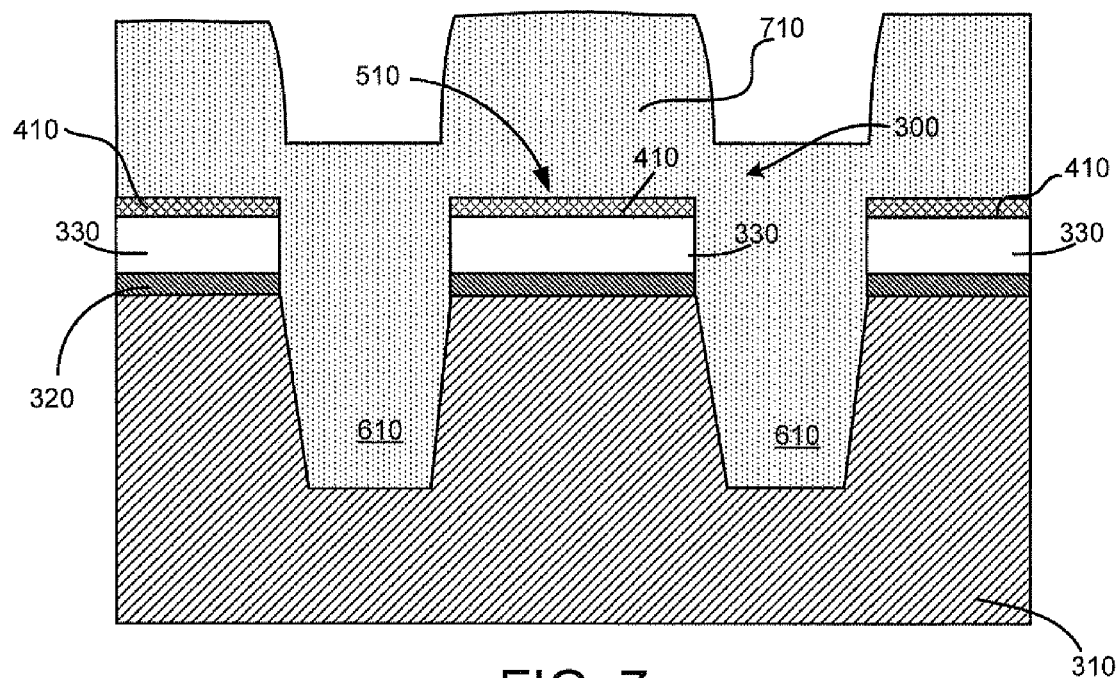

Following formation of trenches 610, a field oxide (FOX) layer 710 may be deposited into trenches 610 and over SiON mask 510, as illustrated in FIG. 7 (act 220). In one implementation consistent with principles of the invention, FOX layer 710 may be deposited by high density plasma chemical vapor deposition (HDP CVD), although suitable alternative deposition techniques may also be employed.

Figure 8:
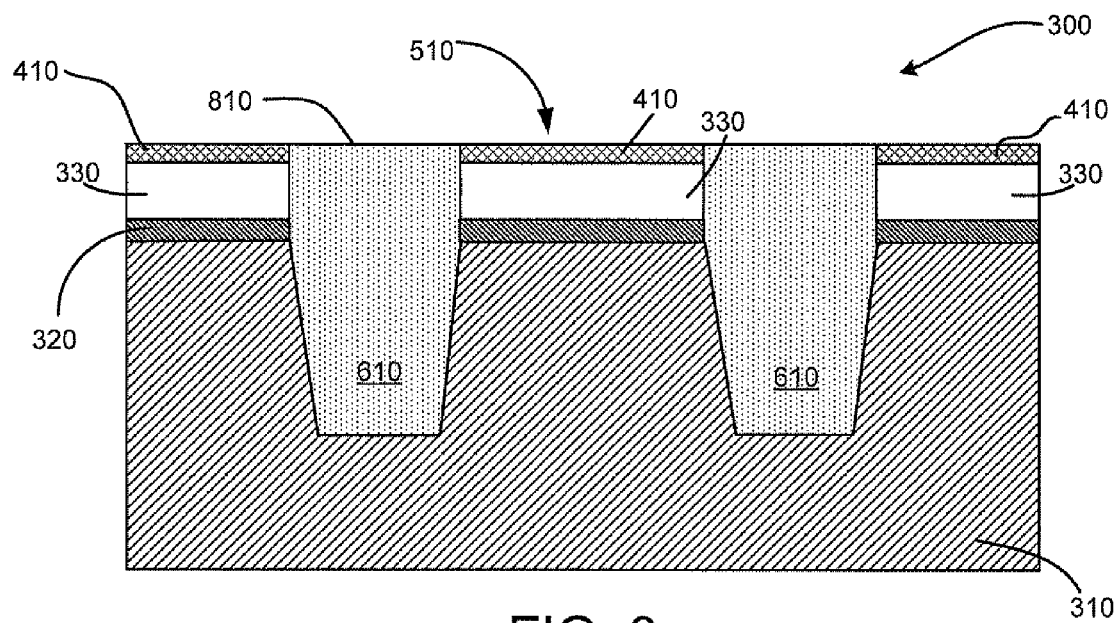

In accordance with aspects described herein, FOX layer 710 may be planarized using, for example, a slurry-based chemical mechanical polishing (CMP) process to form a planar top surface 810 and to expose the upper surface of SiON mask 510, as illustrated, in FIG. 8 (act 225). After the CMP process, the top surface of FOX layer 710 may be substantially planar with the top surface of SiON mask 510. In one implementation, this top surface may be approximately 1000 Å above a top surface of substrate layer 310. In one exemplary implementation, CMP may be performed using at least a ceria-based slurry. In one embodiment, CMP may be initiated using a silica-based slurry that is then transitioned to a ceria-based slurry. By using a SiON mask 510 as a CMP stop layer, a lower selectivity ceria-based slurry may be used at a faster polish rate, resulting in a more robust clearing margin. Clearing margin refers to a device's ability to survive oxide polishing while protecting underlying layers from being adversely effected by the polishing.

As is known, polishing is not performed in a perfectly uniform manner, since some areas of a semiconductor device may need polished more that other areas in order to ensure all the residual oxide is removed from active areas. For the polishing using conventional nitride mask layer 330 (i.e., no SiON mask 510), about 50 Å to 200 Å of nitride layer 330 may be polished depending on the device. However, using SiON mask, none of underlying nitride layer 330 will be polished.

Figure 9:
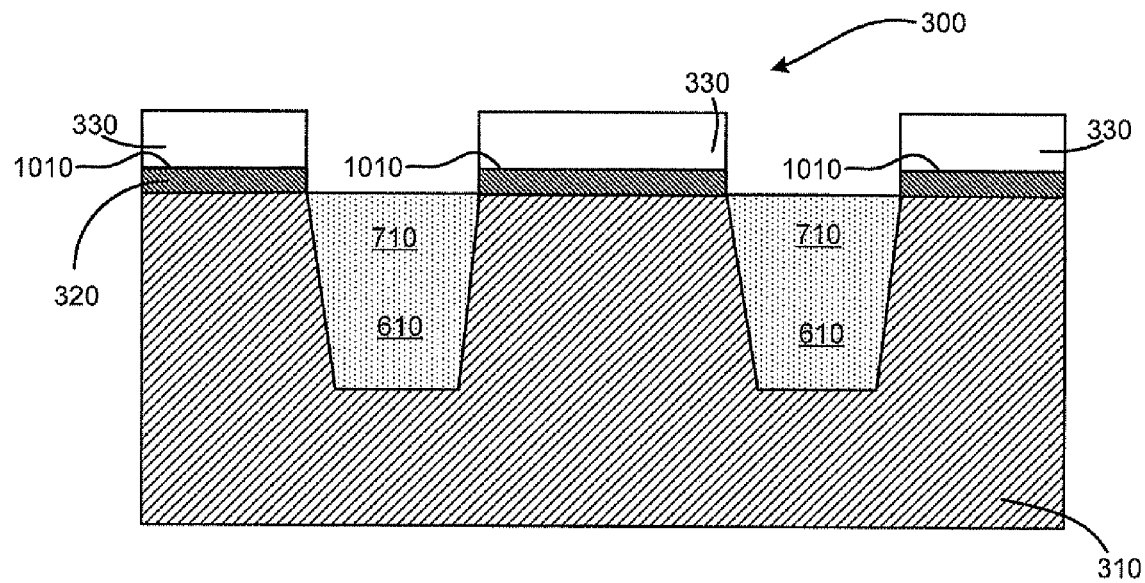

Following trench and FOX layer formation, semiconductor device 300 may be cleaned, as illustrated in FIG. 9, to remove or strip SiON mask 510 and expose a top surface of nitride layer 330 (act 230). Additionally, in one exemplary implementation, FOX layer 710 may also be etched to a level approximately coplanar with a top surface of substrate 310. In one exemplary implementation, SiON mask layer 510 may be etched using a dilute hydrofluoric acid (HF) solution that is selective to SiON 510 and FOX layer 710 and will not remove layer 320 and with minimal damage to charge storage layer 620. It should be understood that the particular etch chemistry, flow rates, RF power, wafer bias voltage, etching duration and other parameters may be optimized based on the particular semiconductor device being etched, the particular plasma etching chamber used and the guidance disclosed herein.

Figure 10:
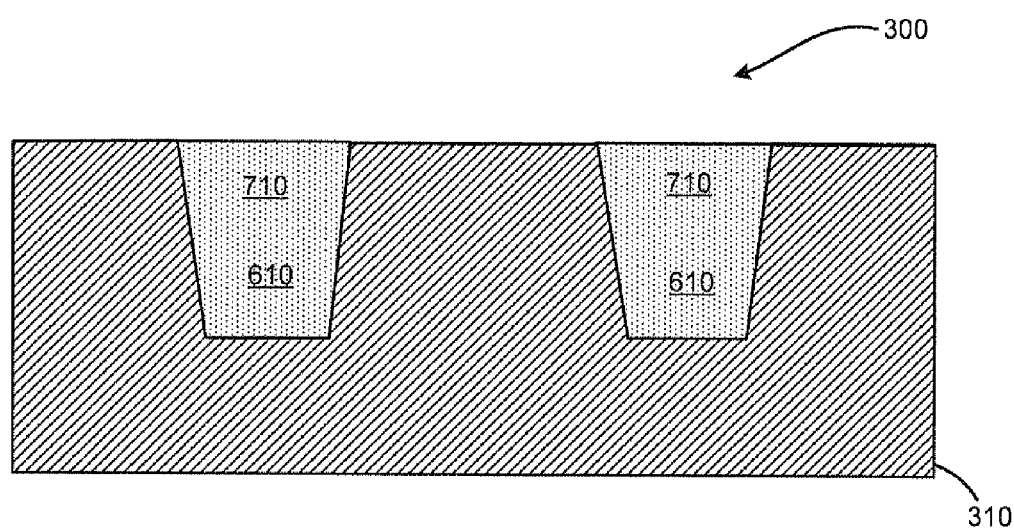

Referring now FIG. 10, following cleaning of SiON mask 510 and FOX layer 510 to desired levels, nitride layer 330 and buffer oxide layer 320 may be removed in a conventional manner (act 235). In one implementation layers 330 and 320 may be etched by a phosphoric acid solution. Following etching of layers 330 and 320, the top surface of substrate layer 310 and the top surface of FOX layer 710 are substantially coplanar.

Figure 11:
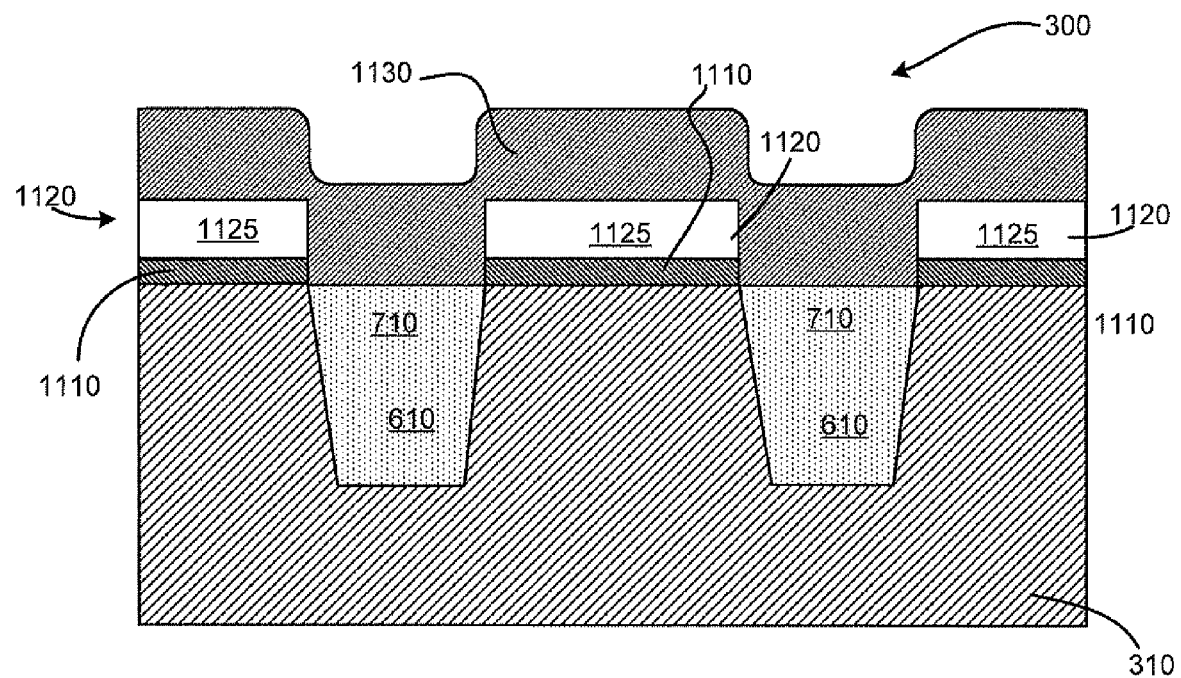
Figure 12:
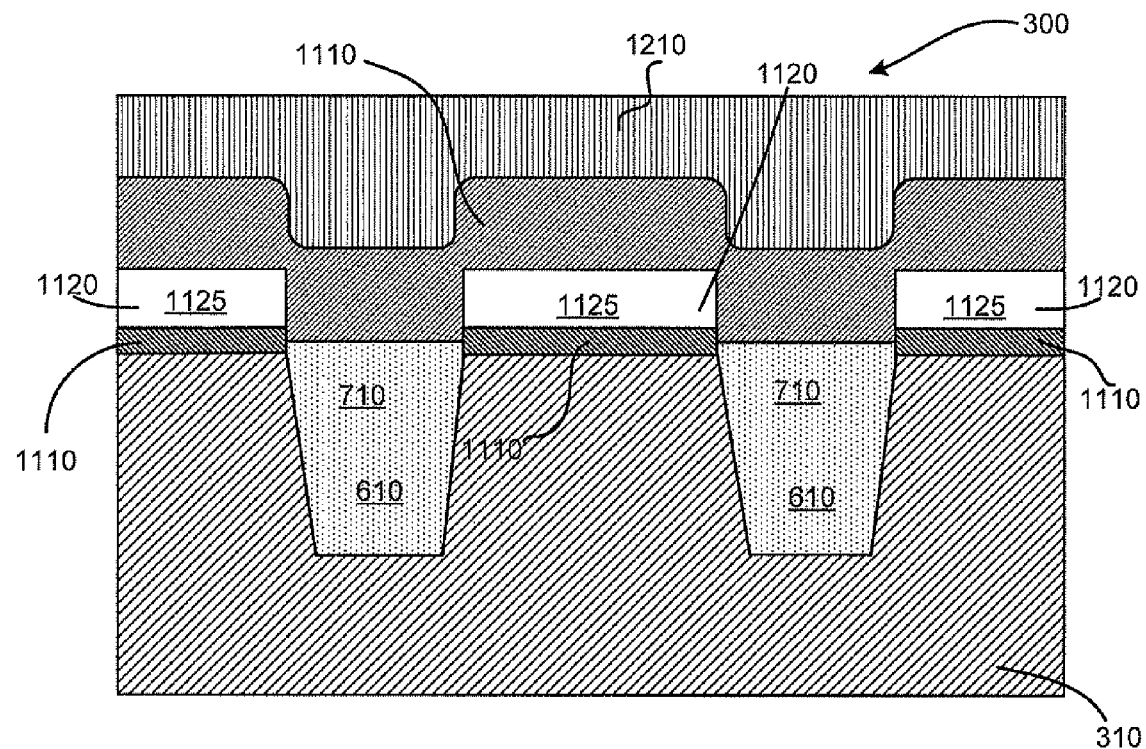

Referring to FIG. 11, gate structures 1120 may be formed in a conventional manner, with each gate structure 1120 including a dielectric layer 1110 and a charge storage element 1125 (act 240). In an exemplary implementation, dielectric layer 1110 may include an oxide, such as a silicon oxide (e.g., $SiO_2$), and may have a thickness ranging from about 50 Å to about 350 Å. Dielectric layer 1110 may function as a tunnel oxide layer for a subsequently formed memory cell of semiconductor device 300. In one implementation consistent with principles of the invention, a suitable method for forming layer 1110 may include thermal oxidation process of layer 310 at a temperature of about 750° C. to 1100° C. Alternatively, dielectric layer 1110 may be deposited using a low pressure chemical vapor deposition (LPCVD) process performed at a temperature of about 400° C. to 800° C.

Charge storage elements 1125 may include a dielectric layer formed on layer 1110 in a conventional manner. In one exemplary implementation, charge storage elements 1125 may include a nitride, such as silicon nitride (e.g., $Si_3N_4$), and may have a thickness ranging from about 50 Å to about 300 Å. Alternatively, charge storage elements 1125 may include a conductive layer, such as a polycrystalline silicon for use as charge storage layer in a subsequently formed device.

An inter-gate dielectric (IGD) layer 1130 may be deposited over the etched FOX layer 710 and charge storage elements 1125 in a conventional manner (act 245). In implementations consistent with aspects described herein, IGD layer 1130 may be an oxide/nitride/oxide (ONO) stack, a nitride/oxide (NO) stack, a tantalum oxide (e.g., $Ta_2O_5$), or any suitable dielectric material. In an exemplary implementation, IGD layer 1110 may be an ONO stack have a thickness ranging from about 100 Å to about 300 Å.

In an alternative implementation, nitride layer 320 may be selectively removed following stripping of SiON mask 510, leaving a very uniform STI field oxide step height across device 300. Minimal STI step height variation across the wafer results in improved control of device performance (field Vt) and improved wafer yield. In this implementation, a charge storage layer may be formed and etched following removal of layer 330 and prior to formation of IGD layer 1110.

Following IGD layer 1110 formation, a control gate layer 1210 may be formed on IGD layer 1110 in a conventional manner, as illustrated in FIG. 11 (act 250). In an exemplary implementation, control gate layer 1210 may include a silicon, such as polycrystalline silicon ("polysilicon"), and may have a thickness ranging from about 1000 Å to about 2000 Å. In one implementation consistent with principles of the invention, a suitable method for forming control gate layer 1110 may include chemical vapor deposition (CVD), although suitable alternative deposition techniques may also be employed. Source and drain regions (not shown) may be formed in substrate 310 in a conventional manner.

Figure 13:
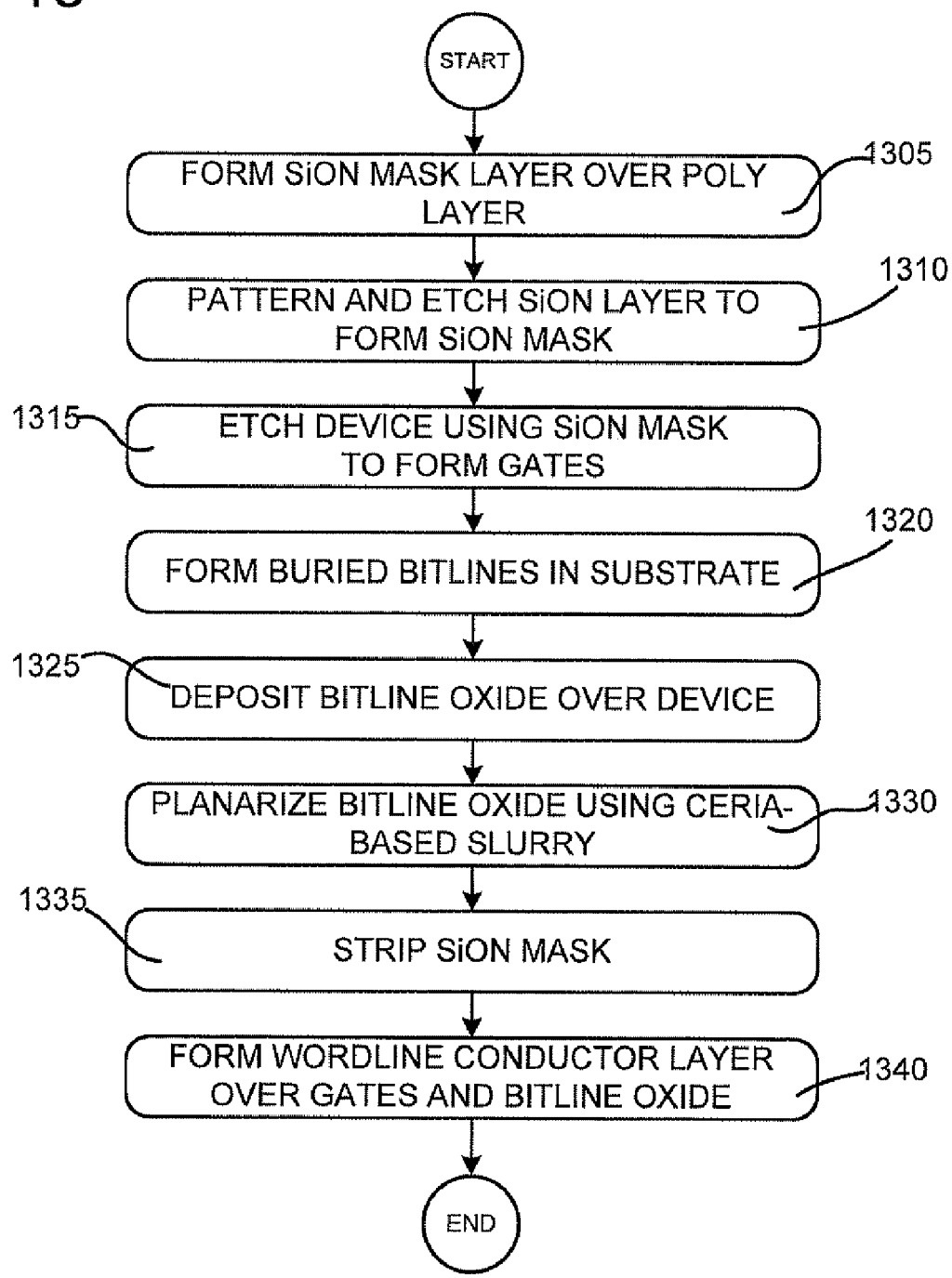
FIG. 13 is a flow diagram illustrating another exemplary process for forming a semiconductor memory device according to an aspect described herein.
Figure 14:
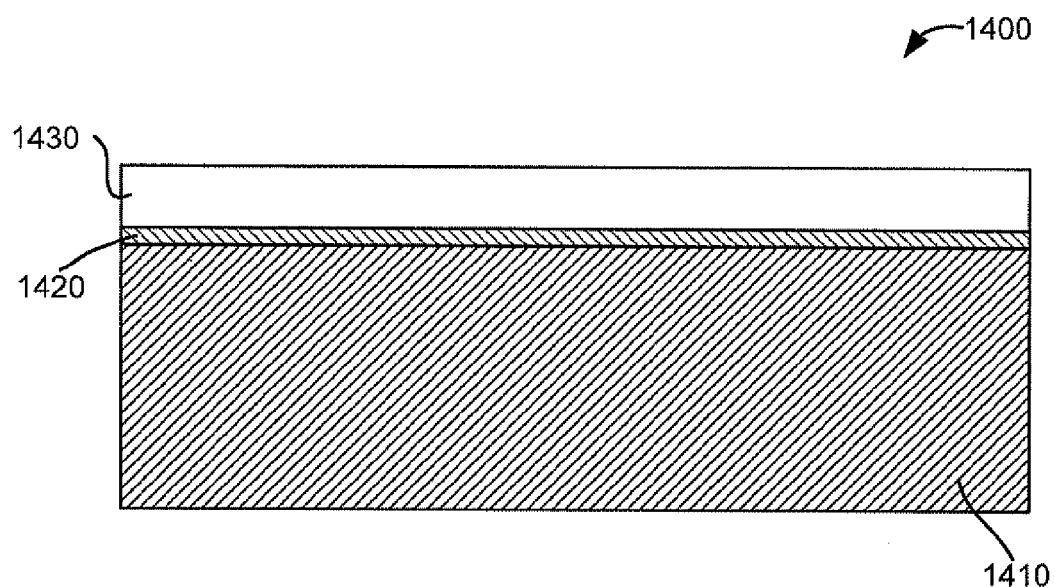
FIGS. 14-21 illustrate exemplary views of a semiconductor memory device fabricated according to the processing described in FIG. 13.

FIG. 13 illustrates another exemplary process for forming a semiconductor memory device in an implementation consistent with aspects described herein. In the implementation of FIG. 13, an SiON mask layer may be used to enhance planarization during bitline formation of a semiconductor device. As with FIG. 2, the semiconductor memory device described in relation to FIG. 13 may include an array of memory cells of a flash memory device, such as that illustrated in FIG. 1. FIGS. 14-21 illustrate exemplary views of a semiconductor memory device fabricated according to the processing described in FIG. 13.

Processing may begin with a semiconductor device 1400 that includes layers 1410, 1420, and 1430. In an exemplary embodiment, layer 1410 may include a substrate of semiconductor device 1400 and may include silicon, germanium, silicon-germanium or other semiconducting materials. In alternative implementations, layer 1410 may be a conductive layer or a dielectric layer formed a number of layers above the surface of a substrate in semiconductor device 1400.

Layer 1420 may be a dielectric layer formed on layer 1410 in a conventional manner. In an exemplary implementation, dielectric layer 1420 may include an oxide, such as a silicon oxide (e.g., $SiO_2$), and may have a thickness ranging from about 50 Å to about 350 Å. In another exemplary implementation, layer 1420 may include an oxide-nitride-oxide (ONO) stack having a thickness ranging from about 100 Å to about 400 Å, where the nitride portion of the ONO stack functions as a charge storage layer for a subsequently formed memory cell in device 1400. In one implementation consistent with principles of the invention, a suitable method for forming layer 1420 may include thermal oxidation process of layer 1410 at a temperature of about 750° C. to 1100° C. Alternatively, dielectric layer 1420 may be deposited using a low pressure chemical vapor deposition (LPCVD) process performed at a temperature of about 400° C. to 800° C.

Layer 1430 may include a second dielectric layer formed on layer 1420 in a conventional manner. In one exemplary implementation, second dielectric layer 1430 may include polycrystalline silicon ("polysilicon"), and may have a thickness ranging from about 500 Å to about 1500 Å. Polysilicon layer 1430 may function as a gate electrode a subsequently formed memory cell of semiconductor device 1400.

Figure 15:
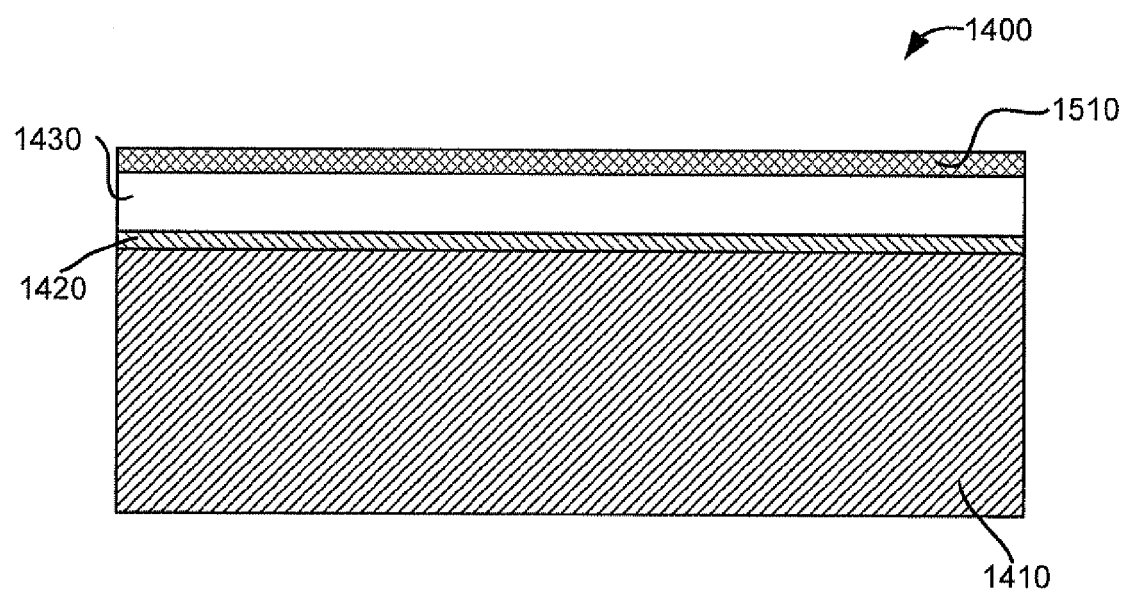

As shown in FIG. 15, a silicon oxynitride (SiON) mask layer 1510 may be formed over layer 1430 (act 1305). In one exemplary implementation, SiON mask layer 1510 may be formed by CVD, and may have a thickness ranging from about 100 Å to about 500 Å. SiON mask layer 1510 may form a anti-reflective coating (ARC).

Figure 16:
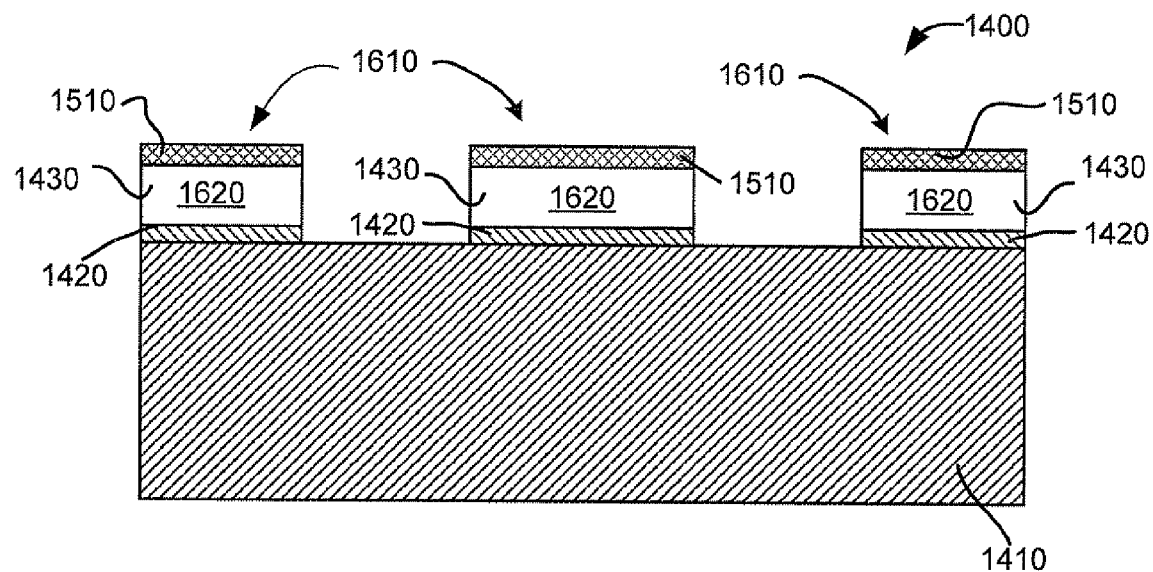

A photoresist material formed over mask layer 1510 may be patterned and etched in a conventional manner to form a hard mask 1610 on the top surface of layer 1430, as illustrated in FIG. 16 (act 1310). Mask 1610 may be used to define active regions in the subsequently formed memory device and indicate areas that will not be etched during formation of isolation regions in semiconductor device 1400. By providing anti-reflective coating SiON mask 1610 beneath a photoresist material prior to performing photolithography, optical reflections of the radiation used to develop the mask pattern may be minimized. Accordingly, by using ARC SiON layer 1510 a more precise lithography may be applied, resulting in narrower mask spacings.

Semiconductor device 1400 may then be etched, as illustrated in FIG. 16, to remove portions of layers 1420 and 1430 and form a number of gate stacks in a pattern within layers 1420 and 1430 (act 1315). Remaining portions of polysilicon layer 1430 may act as a gate electrode layer 1620 for semiconductor device 1400.

Figure 17:
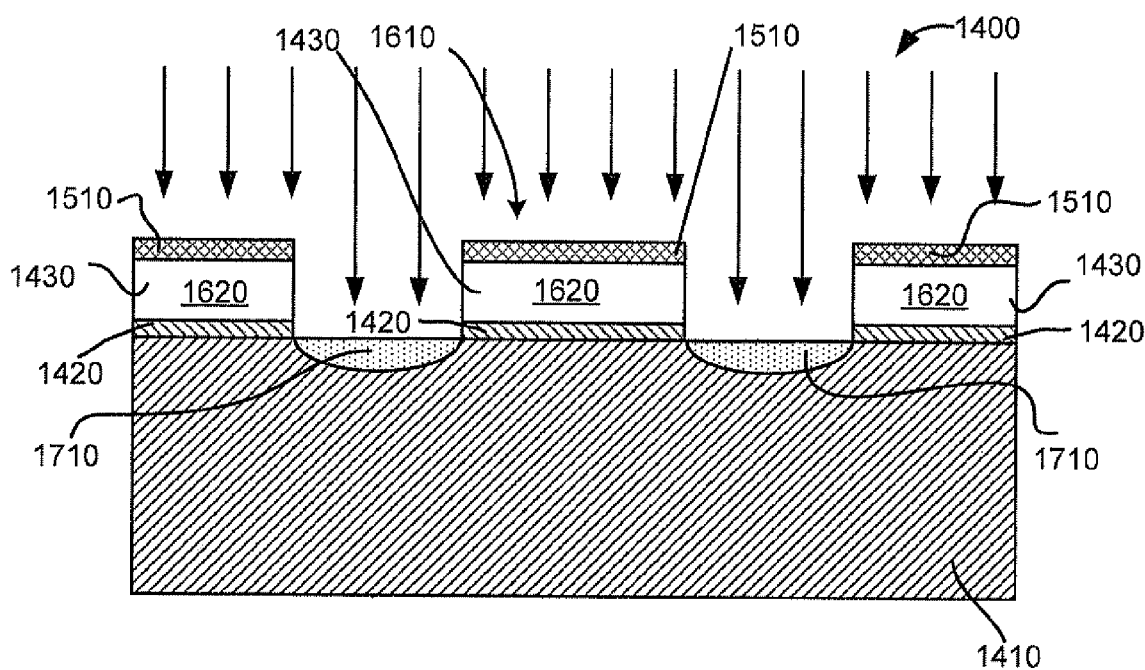

As shown in FIG. 17, buried bitline regions 1710 may be formed in exposed portions of layer 1410 (act 1320). In one implementation, buried bitline regions 1710 may be formed by ion implantation of arsenic using a dose of about $3 \times 10^{15}$ to $5 \times 10^{15}$ ions per square centimeter. The ion implementation energy may be selected to form buried bitline region 1710 to a selected junction depth in substrate layer 1410. As used herein, the term "junction depth" refers to a distance from the surface of substrate layer 1410 to the deepest point of formation of a p/n junction associated with the implanted buried bitline region 1710 within substrate layer 1410. It should be understood that the timing of bitline region formation described above is merely exemplary. For example, bitline region 1710 may be formed by ion implantation through layers 1420 and 1430 prior to formation of SiON mask layer 1610.

Figure 18:
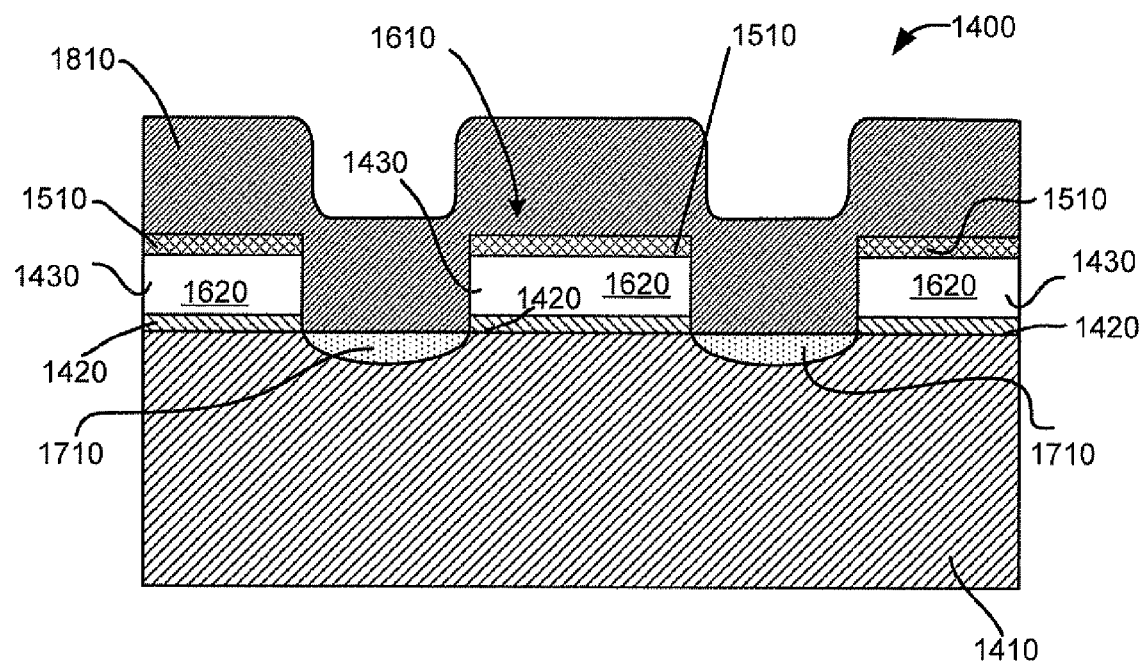

Following formation of buried bitline regions 1710, a bitline oxide layer 1810 may be deposited over bitline regions 1710 and SiON mask 1610, as illustrated in FIG. 18 (act 1325). In one implementation consistent with principles of the invention, bitline oxide layer 1810 may be deposited by high density plasma chemical vapor deposition (HDP CVD), although suitable alternative deposition techniques may also be employed.

Figure 19:
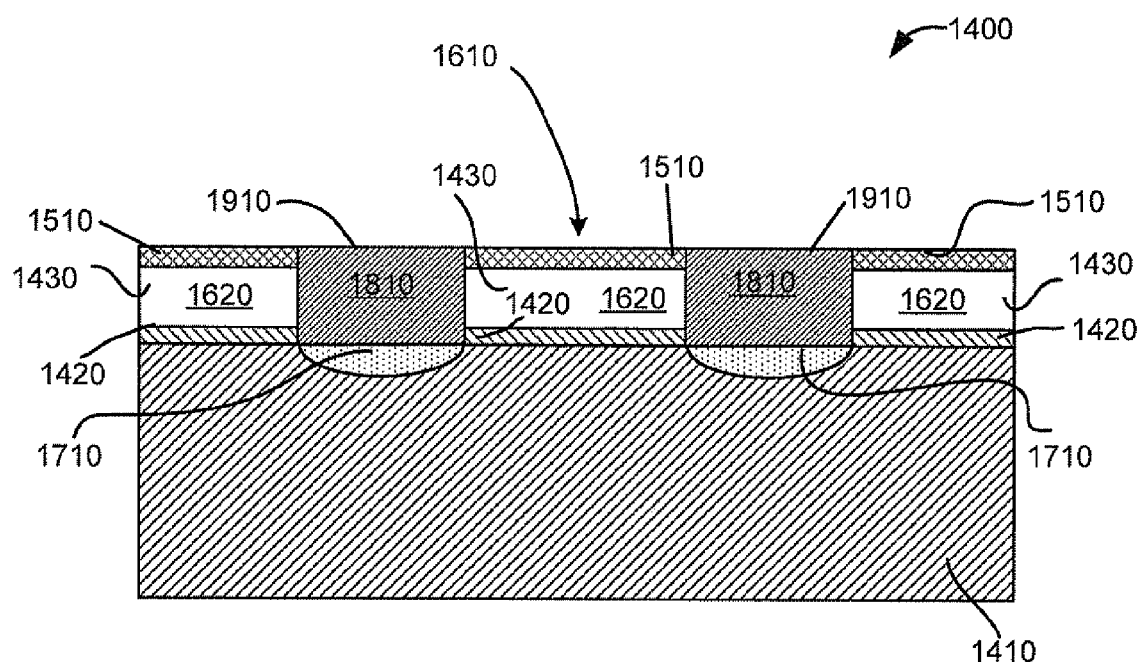

In accordance with aspects described herein, bitline oxide layer 1810 may be planarized using, for example, a slurry-based CMP process to form a planar top surface 1910 and to expose the upper surface of SiON mask 1610, as illustrated, in FIG. 19 (act 1330). After the CMP process, the top surface of bitline oxide layer 1810 may be substantially planar with the top surface of SiON mask 1610. In one exemplary implementation, CMP may be performed using at least a ceria-based slurry. In one embodiment, CMP may be initiated using a silica-based slurry that is then transitioned to a ceria-based slurry following a predetermined period of time. By using a SiON mask 1610 as a CMP stop layer, a lower selectivity ceria-based slurry may be used at a faster polish rate, resulting in a more robust clearing margin.

Figure 20:
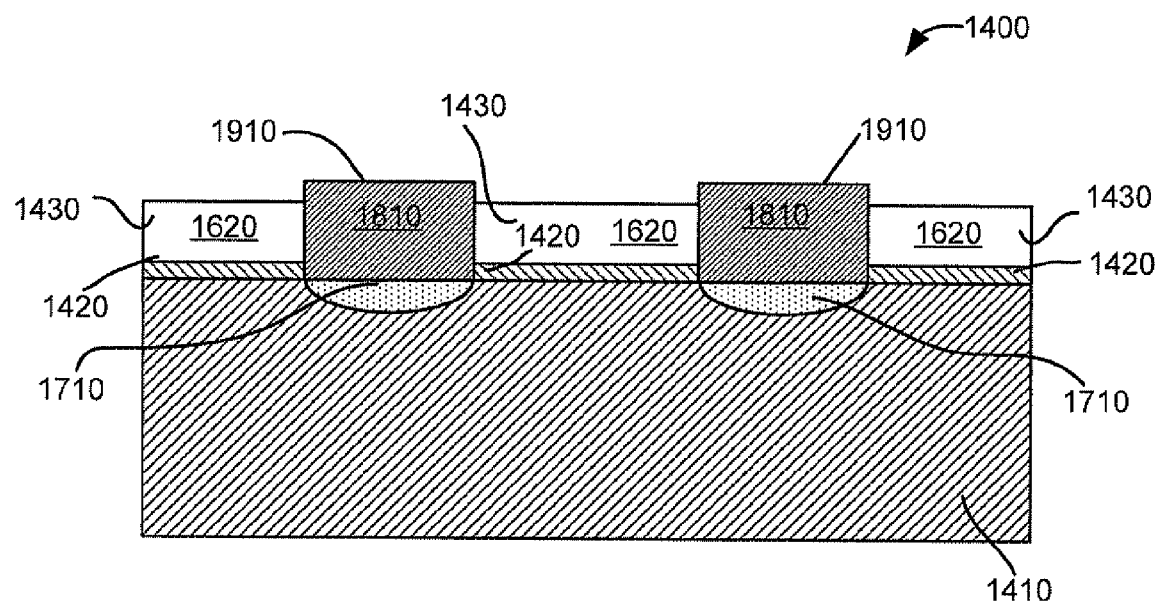

Following planarization of bitline oxide layer 1810, semiconductor device 1400 may be etched, as illustrated in FIG. 20, to remove or strip SiON mask 1610 and expose a top surface of gate electrode layer 1620 (act 1335). In one exemplary implementation, SiON mask layer 1610 may be etched using a wet etching technique using, for example, phosphoric acid, to limit the etching to only SiON mask layer 1610 without damaging gate electrode layer 1620 or bitline oxide layer 1810.

In an alternative implementation, SiON mask 1610 may be removed using a dry plasma etching technique using, for example, a fluorinated hydrocarbon gas, such as e.g., $CH_3F$, $CHF_3$, and $CH_2F_2$ having high selectivity for removing only the SiON mask 1610 without substantially etching bitline oxide layer 1810 or gate electrode layer 1620. Following etching of SiON mask layer 1610, a portion of bitline oxide layer 1810 may form a protrusion above the surface of gate electrode layer 1620, as illustrated in FIG. 20.

Figure 21:
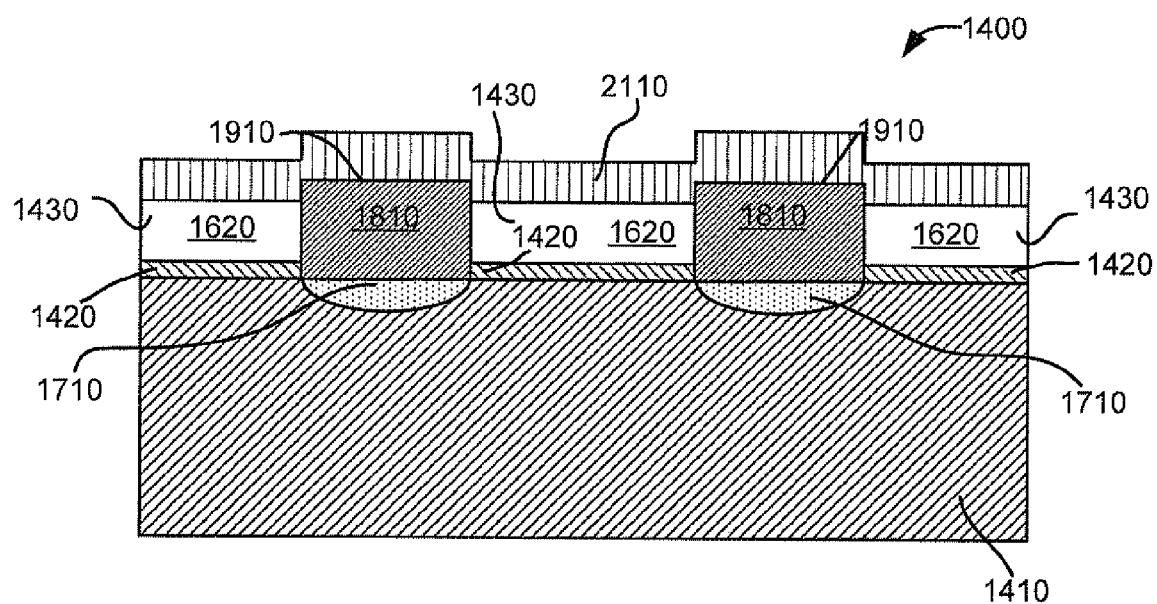

Referring to FIG. 21, a wordline conductor layer 2110 may be formed over the gate electrode layer 1620 and bitline oxide layer 1810 in a conventional manner (act 1340). For example, a metal, such as copper, tungsten or aluminum, may be deposited to form an interconnect that connects various features in semiconductor device 1400, such as gate layers 1620 to an external electrode, to facilitate operation (e.g., programming, erasing, etc.) of the semiconductor device 1400.

The description above focuses on a semiconductor memory devices 300 and 1400, such as an EEPROM, that stores one bit of data per memory cell. In other implementations, a number of memory cells may be configured to store two or more bits of data. That is, charge storage layers 330 and 1420 may be programmed to store charges representing two or more separate bits of data by localizing the charges to the respective portions of charge storage layers 330 and 1420. Each of the charges of the memory cell may be programmed independently by, for example, channel hot electron injection, to store a charge on each respective side of the charge storage layers 330 and 1420. In this manner, the charges in charge storage layers 330 and 1420 become effectively trapped in respective portions of charge storage layers 330 and 1420. Erasing of each charge in the memory cell may also be performed independently. During Fowler-Nordheim (FN) erasing, the charges stored in charge storage layers 330 and 1420 may tunnel through dielectric layers 320 and 1420, respectively. In this manner, the density of the resulting memory array in semiconductor devices 300 and 1400 may be increased as compared to conventional memory devices that store only one bit of data per cell.

In the previous descriptions, numerous specific details are set forth, such as specific materials, structures, chemicals, processes, etc., in order to provide a thorough understanding of the invention. However, implementations described herein may be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Aspects described herein may be applicable in the manufacturing of semiconductor devices and particularly in memory devices having small design features and high circuit density. However, the described aspects are applicable to the formation of any of various types of semiconductor devices, and hence, details have not been set forth in order to avoid obscuring the thrust of the invention.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 2 and 13, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:
   forming a silicon oxynitride mask layer over a first layer;
   etching the first layer using the silicon oxynitride mask layer, to form a pattern in the first layer;

filling the pattern with a dielectric material to form a dielectric layer;

polishing the dielectric material with a silica-based slurry for a first predetermined period of time at a first polishing rate; and polishing, at a second polishing rate that is faster than the first polishing rate, the dielectric material with a ceria-based slurry for a second predetermined period of time using the silicon oxynitride mask layer as a stop layer following the polishing the dielectric material with the silica-based slurry.

2. The method of claim 1, where the silicon oxynitride mask layer comprises an anti-reflective layer.

3. The method of claim 1, where the dielectric layer comprises an oxide layer.

4. The method of claim 1, where the silicon oxynitride mask layer has a thickness ranging from about 100 Å to about 500 Å.

5. The method of claim 1, where the first layer comprises at least a substrate layer.

6. The method of claim 5, where the first layer further comprises a second dielectric layer formed over the substrate layer.

7. The method of claim 6, where the second dielectric layer comprises a nitride layer.

8. The method of claim 5, where the pattern in the first layer comprises a trench in the substrate layer.

9. The method of claim 8, where the dielectric layer comprises a field oxide layer.

10. The method of claim 9, further comprising:
selectively removing the silicon oxynitride mask layer; and
forming at least two charge storage elements over the substrate layer on opposite sides of the trench.

11. The method of claim 1, further comprising:
forming a second layer over the first layer, where the first layer comprises a substrate layer and the second layer comprises a sacrificial nitride layer formed over the substrate layer.

12. The method of claim 11, further comprising:
selectively removing the sacrificial nitride layer; and
forming a gate structure over the substrate layer.

13. The method of claim 12, where the etching the first layer comprises forming a pattern in the gate structure.

14. The method of claim 11, where the dielectric layer is a bitline oxide layer.

15. A method for fabricating a semiconductor device, comprising:
forming a first dielectric layer over a substrate;
forming a second dielectric layer over the first dielectric layer;
forming a silicon oxynitride mask layer over the second dielectric layer;
forming a photoresist layer over the silicon oxynitride mask layer;
patterning the photoresist layer to define mask regions;
etching the silicon oxynitride mask layer to form a silicon oxynitride mask;
etching the substrate, the first dielectric layer, and the second dielectric layer to form at least one isolation trench in a portion of the substrate not covered by the silicon oxynitride mask;
filling the trench with a dielectric material;
polishing the dielectric material with a silica-based slurry for a first predetermined period of time and at a first polishing rate;
polishing, at a second polishing rate that is faster than the first polishing rate, the dielectric material with a ceria-based slurry for a second predetermined period of time using the silicon oxynitride mask layer as a stop layer following the polishing the dielectric material with the silica-based slurry;
stripping the silicon oxynitride mask from the semiconductor device;
forming a third dielectric layer over the second dielectric layer and the dielectric material; and
forming a control gate over at least a portion of the third dielectric layer.

16. A method for fabricating a semiconductor device, comprising:
forming a first dielectric layer over a substrate;
forming a gate electrode layer over the first dielectric layer;
forming a silicon oxynitride mask over the gate electrode layer;
etching the first dielectric layer and the gate electrode layer;
forming a bitline region in a portion of the substrate;
forming an oxide layer over the semiconductor device, the oxide layer filling regions etched by the etching;
polishing the oxide layer with a silica-based slurry for a first predetermined period of time at a first polishing rate;
polishing, at a second polishing rate that is faster than the first polishing rate, the oxide layer with a ceria-based slurry for a second predetermined period of time using the silicon oxynitride mask as a stop layer following the polishing the oxide layer with the silica-based slurry;
stripping the silicon oxynitride mask from the semiconductor device; and
forming a wordline conductor layer over the gate electrode layer and the oxide layer.

17. The method of claim 16, where the silicon oxynitride layer has a thickness ranging from about 100 Å to about 500 Å.

* * * * *